United States Patent
Liu et al.

(10) Patent No.: US 9,634,270 B2
(45) Date of Patent: Apr. 25, 2017

(54) METHOD FOR MANUFACTURING FLEXIBLE DISPLAY PANEL AND FLEXIBLE DISPLAY DEVICE

(71) Applicant: BOE Technology Group Co., Ltd., Beijing (CN)

(72) Inventors: Lu Liu, Beijing (CN); Ming Che Hsieh, Beijing (CN); Chunyan Xie, Beijing (CN); Tao Sun, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 14/769,332

(22) PCT Filed: Oct. 17, 2014

(86) PCT No.: PCT/CN2014/088814
§ 371 (c)(1),
(2) Date: Aug. 20, 2015

(87) PCT Pub. No.: WO2016/011712
PCT Pub. Date: Jan. 28, 2016

(65) Prior Publication Data
US 2016/0181554 A1 Jun. 23, 2016

(30) Foreign Application Priority Data
Jul. 22, 2014 (CN) .......................... 2014 1 0350125

(51) Int. Cl.
*H01L 51/00* (2006.01)
*H01L 51/52* (2006.01)
(Continued)

(52) U.S. Cl.
CPC ...... *H01L 51/0097* (2013.01); *H01L 27/3244* (2013.01); *H01L 51/0003* (2013.01);
(Continued)

(58) Field of Classification Search
CPC ..... H01L 51/00; H01L 51/52; H01L 51/0097; H01L 51/5253
See application file for complete search history.

(56) References Cited

U.S. PATENT DOCUMENTS 6,249,372 B1 * 6/2001 Kobayashi ............ H01L 27/322
250/486.1
2004/0160178 A1 * 8/2004 Qiu ...................... H01L 51/5256
313/512
(Continued)

FOREIGN PATENT DOCUMENTS

CN 101813863 A 8/2010
CN 101964398 A 2/2011
(Continued)

OTHER PUBLICATIONS

Jan. 28, 2016—(CN)—First Office Action Appn 201410350125.7 with English Tran.
(Continued)

*Primary Examiner* — Phuc Dang
(74) *Attorney, Agent, or Firm* — Banner & Witcoff Ltd.

(57) ABSTRACT

A method for manufacturing a flexible display panel and the flexible display device are disclosed. The method for manufacturing the flexible display panel includes: forming a substrate, a flexible display and an overcoat layer on a support substrate in sequence; flipping over so that one side provided with the support substrate is placed upward; stripping off the support substrate; coating a curable material on a surface obtained after the support substrate is stripped off; and performing a curing process so that the coated curable material is cured to form a protective film. The method for manufacturing the flexible display panel can form the protective film without adopting laminating/bonding devices, is simple and easy, and does not require the vacuum defoamation process subsequently.

17 Claims, 2 Drawing Sheets

(51) Int. Cl.
*H01L 51/56* (2006.01)
*H01L 27/32* (2006.01)

(52) U.S. Cl.
CPC ........ *H01L 51/003* (2013.01); *H01L 51/5253* (2013.01); *H01L 51/56* (2013.01); *H01L 2251/5338* (2013.01)

(56) References Cited

U.S. PATENT DOCUMENTS

| | | | |
|---|---|---|---|
| 2010/0308335 A1 | 12/2010 | Kim et al. | |
| 2011/0259387 A1* | 10/2011 | Wu | H01L 31/068 136/244 |
| 2012/0301676 A1* | 11/2012 | Ushida | G02B 1/105 428/148 |
| 2014/0017967 A1* | 1/2014 | Kim | H01J 9/00 445/25 |
| 2014/0021856 A1* | 1/2014 | Jung | H01L 51/5253 313/504 |
| 2014/0061610 A1* | 3/2014 | Mun | H01L 51/003 257/40 |
| 2014/0339581 A1* | 11/2014 | Kwon | H01L 33/0079 257/94 |
| 2015/0255756 A1* | 9/2015 | Chiang | B32B 43/006 156/184 |

FOREIGN PATENT DOCUMENTS

| | | |
|---|---|---|
| CN | 102983289 A | 3/2013 |
| CN | 103928398 A | 7/2014 |
| KR | 102014006776 A | 5/2014 |
| KR | 1020130044626 A | 10/2014 |

OTHER PUBLICATIONS

Apr. 28, 2015—International Search Report and Written Opinion Appn PCT/CN2014/088814 with English Tran.
Oct. 19, 2016—(CN) Third Office Action Appn 201410350125.7 with English Tran.
Jul. 14, 2016—(CN)—Second Office Action Appn 201410350125.7 with English Tran.

* cited by examiner

US 9,634,270 B2

METHOD FOR MANUFACTURING FLEXIBLE DISPLAY PANEL AND FLEXIBLE DISPLAY DEVICE

The application is a U.S. National Phase Entry of International Application No. PCT/CN2014/088814 filed on Oct. 17, 2014, designating the United States of America and claiming priority to Chinese Patent Application No. 201410350125.7 filed on Jul. 22, 2014. The present application claims priority to and the benefit of the above-identified applications and the above-identified applications are incorporated by reference herein in their entirety.

TECHNICAL FIELD

Embodiments of the present invention relate to a method for manufacturing a flexible display panel and a flexible display device.

BACKGROUND

The traditional flat-panel display technology has been gradually developed to mature. Flexible displays will soon become the mainstream of the display field due to the characteristics of light weight and thin profile property, flexibility, and impact resistance. Currently, in the display technology capable of realizing flexible display, organic light-emitting diode (OLED) display has become the focus of research in the flexible display field in recent years due to the excellent performances such as rapid response speed, wide viewing angle, high brightness and low power consumption and the characteristics such as self-luminousness, bending resistance, etc.

OLED devices are very sensitive to water vapor and oxygen and re prone to decay. An effective encapsulation can prevent the entering of water vapor and oxygen, prevent the aging of organic materials, and prolong the life of the OLED devices.

SUMMARY

At least one embodiment of the present invention provides a method for manufacturing a protective film of a flexible display device and the flexible display device, which can form the protective film without adopting laminating/bonding means, are simple and easy, and do not require the vacuum defoamation process subsequently.

At least one embodiment of the present invention provide a method for manufacturing a protective film of a flexible display device, which comprises: forming a laminated layer of a substrate, a flexible display and an overcoat layer on a support substrate in sequence; flipping over so that one side provided with the support substrate is placed upward and the laminated layer of the substrate, the flexible display, and the overcoat layer is placed downward; stripping off the support substrate; coating a curable material on a surface of the laminated layer of the substrate, the flexible display, and the overcoat layer after the support substrate is stripped off; and performing a curing process so that the coated curable material is cured to form a protective film.

In one example, for instance, the curable material is a photocurable material; and the curing process is correspondingly light illumination.

In one example, the photocurable material is, for instance, an unsaturated polyester resin.

In one example, for instance, the curable material is thermosetting material; and the curing process is correspondingly heat treatment.

In one example, for instance, in the process of coating the curable material on the surface after the support substrate is stripped off, the coating thickness of the curable materials is set according to the following requirement: the protective film formed after the curable material is cured can ensure that the flexible display is disposed at a neutral layer of the entire flexible display panel.

In one example, for instance, the curable material is directly coated in situ on the surface exposed after the support substrate is stripped off.

In one example, for instance, in the manufacturing process, the flexible display panel is sucked by a vacuum suction arm.

In one example, for instance, in the process of coating the curable material on the surface after the support substrate is stripped off, the adopted coating means includes: spin-coating or slot coating.

In one example, for instance, the support substrate is stripped off by laser lift-off (LLO) technology.

In at least one embodiment of the present invention, for instance the substrate may be prepared by polyimide (PI), polyethylene naphthalate (PEN), polyethylene terephthalate (PET), polycarbonate (PC), polyethersulfone (PES) or polymethyl methacrylate (PMMA).

At least one embodiment of the present invention further provides a flexible display device, which comprises the flexible display panel manufactured by any aforesaid manufacturing method.

BRIEF DESCRIPTION OF THE DRAWINGS

Simple description will be given below to the accompanying drawings of the embodiments to provide a more clear understanding of the technical proposals of the embodiments of the present invention. Obviously, the drawings described below only involve some embodiments of the present invention but are not intended to limit the present invention.

REFERENCE NUMERALS OF THE ACCOMPANYING DRAWINGS

10—Support substrate, 11—PI Substrate, 12—Flexible Display, 13—Curable Material, 14—Protective Film, 15—Overcoat layer, 20—Vacuum Suction Arm.

DETAILED DESCRIPTION

For more clear understanding of the objectives, technical proposals and advantages of the embodiments of the present invention, clear and complete description will be given below to the technical proposals of the embodiments of the present invention with reference to the accompanying drawings of the embodiments of the present invention. Obviously, the preferred embodiments are only partial embodiments of the present invention but not all the embodiments. All the other embodiments obtained by those skilled in the art without creative efforts on the basis of the embodiments of the present invention illustrated shall fall within the scope of protection of the present invention.

Figure 1:
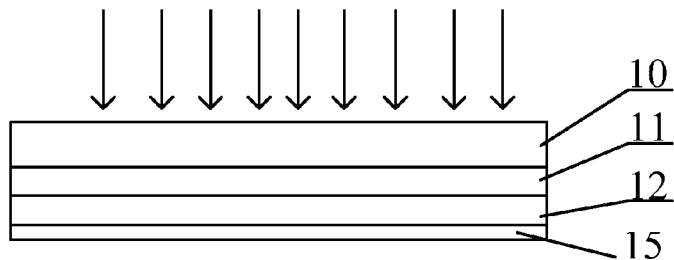
FIG. 1 is a schematic structural view illustrating the process of stripping off a glass substrate by a laser lift-off (LLO) technology.

As illustrated in FIG. 1, for the convenience of production, in the process of manufacturing an OLED flexible display device, a polyimide (PI) substrate 11, a flexible display 12 (e.g., an OLED device) and an overcoat layer 15 are formed on a support substrate 10 (e.g., a glass substrate) in sequence; subsequently, the obtained product is flipped over so that the support substrate 10 is placed upward and correspondingly the laminated layer of the PI substrate 11, the flexible display 12 (e.g., the OLED device) and the overcoat layer 15 is placed downward, and the support substrate 10 is stripped off by a laser lift-off (LLO) technology; and finally, the laminated layer is transferred to a laminating machine, and a protective film bonded with adhesive is covered by the laminating machine on a surface of the laminated layer exposed after the support substrate 10 (e.g., the glass substrate) is stripped off. The protective film is generally a PEN (Polyethylene Naphthalate) film or a PET (Polyethylene Terephthalate, e.g., high-temperature resistant PET) film, and the film thickness is 125 μm.

As for the technology as shown in FIG. 1, the inventors have noted that the used lamination method not only tends to damage the flexible display but also has the following problems: firstly, after the glass substrate is stripped off, the flexible display is flexible and difficult to be processed and hence is not favorable to pick and transfer; and secondly, bubbles tend to be produced in the laminating process, so that the vacuum defoamation process is also required subsequently.

In the method for manufacturing the flexible display panel and the flexible display device, provided by at least one embodiment of the present invention, the operation is simple and easy; and as no bubbles are produced, the vacuum defoamation process is also not required subsequently.

Figure 2:
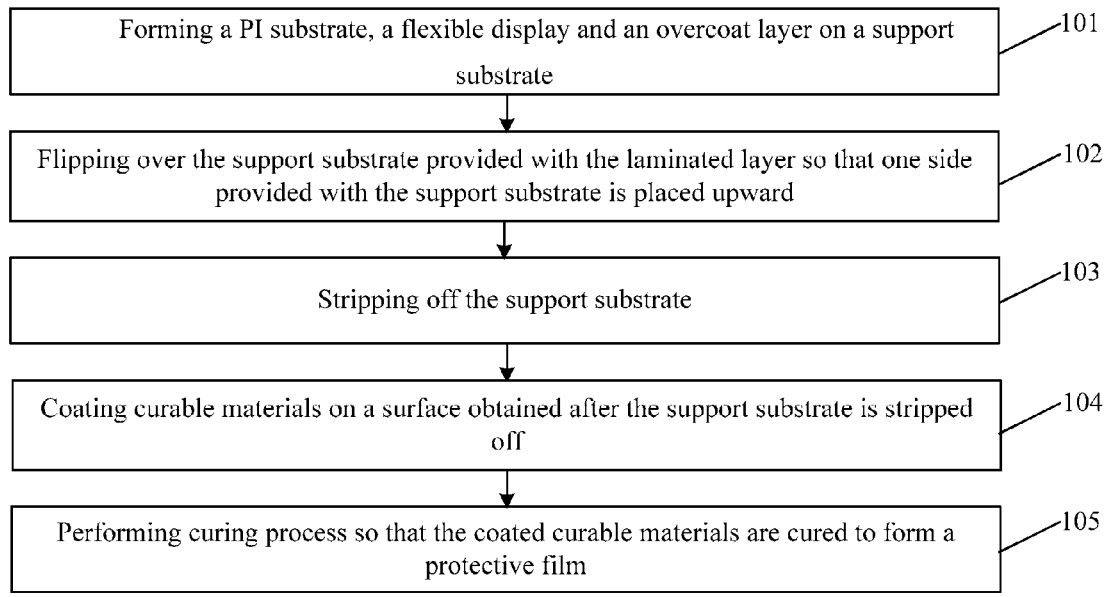
FIG. 2 is a flowchart of a method for manufacturing a flexible display panel, provided by an embodiment of the present invention.

At least one embodiment of the present invention provides a method for manufacturing a flexible display panel. As illustrated in FIG. 2, the manufacturing process comprises:

101: forming a PI substrate 11, a flexible display 12 and an overcoat layer 15 on a support substrate 10.

Figure 3:
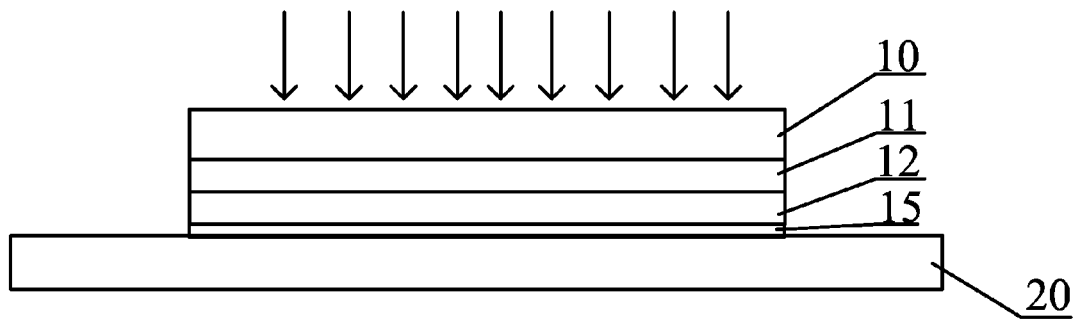
FIG. 3 is a schematic diagram illustrating the process of stripping off a glass substrate by an LLO technology in an embodiment of the present invention.

As illustrated in FIG. 3, in the step, a laminated layer of the PI substrate 11, the flexible display 12 and the overcoat layer 15 is formed on the support substrate 10 in sequence. As the flexible display panel is flexible and difficult to be processed, the flexible display panel may be formed on the support substrate 10 at first and then the support substrate 10 is stripped off. In practice, a glass substrate may be adopted as the support substrate. In an embodiment of the present invention, the flexible display is, for instance, an OLED display or an electro-phoretic display (EPD). The manufacturing method, the structure and the like of the flexible display can be achieved in accordance with the known technologies. The selection of the flexible display is not limited in the present invention.

102: flipping over the support substrate 10 provided with the laminated layer so that the side provided with the support substrate 10 is placed upward, as shown in FIG. 3.

In the step, the support substrate 10 obtained after step 101 is flipped over so that the side provided with the flexible display 12 and the overcoat layer 15 is placed downward and the side provided with the support substrate 10 is placed upward. Thus, the support substrate 10 is exposed, which is helpful to the process of stripping off the support substrate 10 in the next step.

Figure 4:
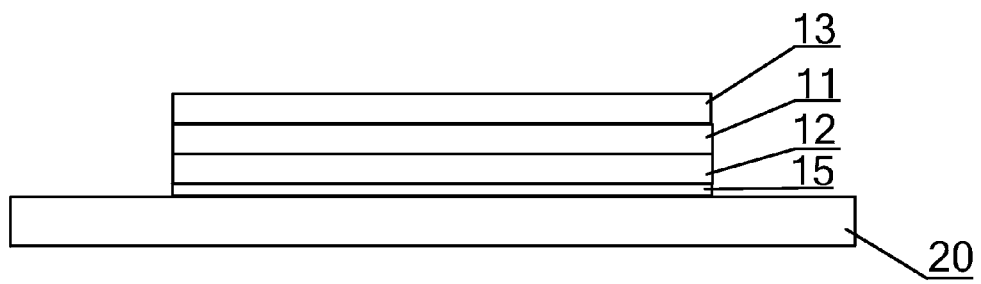
FIG. 4 is a schematic structural view of a product obtained after a curable material is coated in an embodiment of the present invention.

103: stripping off the support substrate 10, as shown in FIG. 4.

In the step, the support substrate 10 is stripped off from the flexible display panel. The specific methods is not limited here. When the glass substrate is adopted as the support substrate, the support substrate 10 may be stripped off by an LLO technology.

Figure 5:
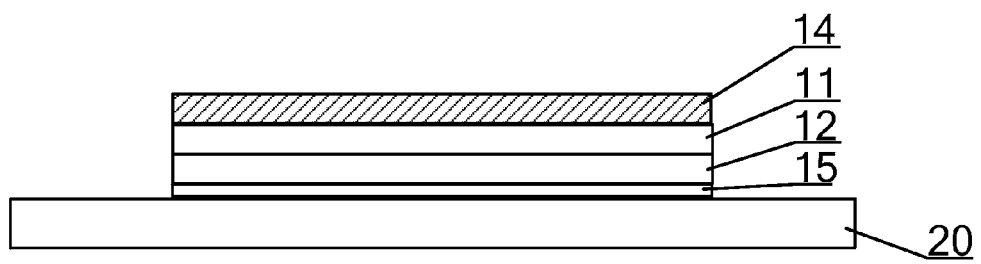
FIG. 5 is a schematic structural view of a flexible display panel formed in an embodiment of the present invention.

104: coating a curable material 13 on a surface obtained after the support substrate is stripped off, as shown in FIG. 5.

The process of converting the liquid state of a material into the solid state is collectively referred to as a curing process. In the embodiment, the curable material is applied to form the protective film of the flexible display device: a curable material satisfying the requirement of the protective film after film formation is selected and coated for forming a film; and subsequently, the curing reaction is promoted under appropriate conditions so that the curable material is cured to form the protective film. In the step, the curable material for forming the protective film is not limited to a single kind of material as long as a component capable of producing curing reaction is contained.

The coating method applied in the step includes: spin-coating or slot coating. These two methods may respectively correspond to materials with different viscosities. If the viscosity of the material is less than 1,000 cp, a spin-coating method is adopted. If the viscosity of the materials is 1,000 to 10,000, a slot coating method is adopted. As for other film forming means, e.g., bonding, pressure will be generated in the bonding process to damage the flexible display. But the process of film forming by coating can avoid the damage to the flexible display and adjust the film thickness.

105: performing a curing process so that the coated curable material 13 is cured to form a protective film 14, as shown in FIG. 5.

In the step, the coated curable material 13 is placed under appropriate conditions, and the curing reaction is promoted so that the curable material 13 is cured to form the protective film 14.

In the embodiment of the present invention, the substrate is not limited to the PI substrate 11 and may also be prepared by other material that is can be applied to a plastic substrate for a flexible display device, e.g., PEN, PET, PC, PES and PMMA.

In the method for manufacturing the flexible display panel, provided by at least one embodiment of the present invention, the flexible display is formed on the support substrate at first; subsequently, the support substrate is stripped off; and the protective film is formed on the surface exposed after the support substrate is stripped off by the curing film forming means. The operation is simple and easy; the obtained product is not required to be transferred to a laminating/bonding device for the laminating/bonding of a film; and the formed protective film is not formed with bubbles therein, and the vacuum defoamation process is not required subsequently any more. Although the flexible display panel, that is obtained after the support substrate is stripped off, is flexible and difficult to be processed, in the film forming method adopted in at least one embodiment of the present invention, the process of film forming by coating can be performed in situ, and the positional transfer of the device is not required. The film thickness of the protective film formed by the above methods may be adjusted so that the flexible display is disposed at a neutral layer of the entire display device and cannot be easily disengaged from electrodes in the bending process.

"The flexible display being disposed at the neutral layer of the entire display device" in the application means that the lamination of the layers above and beneath the flexible display has an equal thickness, so that in the bending process, the layer(s) above the flexible display is stretched and the layer(s) beneath the flexible display is extruded, while the flexible display is disposed in a transition layer which is not stretched and is not extruded, where the stress is almost equal to zero, namely the stress of the "neutral layer" in the bending process is almost zero. Thus, in the process of coating the curable material on the surface after the support substrate is stripped off in the step 104, the coating thickness of the curable material is select to be an appropriate value and may be set according to the following requirement: the protective film formed after the curing of the curable material can ensure that the flexible display is disposed at the neutral layer of the entire flexible display panel. In practice, the thickness of the protective film for ensuring that the flexible display is disposed above the neutral layer of the entire flexible display panel may be calculated by simulation test, and the thickness of the curable materials to be coated in the step 104 is calculated backward.

For instance, in at least one embodiment of the present invention, the curable material is a photocurable material, and correspondingly the curing process is light illumination.

Photo-curing refers to the curing process of monomeric, oligomeric or polymeric matrixes under photo induction and may be applied in the film forming process. Photo-curing reaction essentially involves photo-induced polymerization and crosslinking reaction. There are various kinds of photocurable materials and there are mature technologies therefor. Currently widely applied photocurable materials include photocurable coating, photocurable ink and photocurable adhesive. In at least one embodiment of the present invention, the photocurable materials are applied in the forming of the protective film of the flexible display device: the surface of the protective film to be formed is coated and light-illuminated to form the protective film; the process of light illumination may be directly performed in situ and the position transfer of the device is not required; the operation is simple and easy; and the formed protective film is not formed with bubbles. Moreover, the film thickness of the protective film formed by the above method may be adjusted so that the flexible display is disposed at the neutral layer of the entire display device.

In at least one embodiment of the present invention, the components of the photocurable material for forming the protective film are not limited to material for initiating photo-curing, as long as the photocurable material contain a component capable of producing photo-curing reaction in at least one embodiment of the present invention. For instance, the photocurable materials may include unsaturated polyester resin, epoxy acrylate resin, etc.

In at least one embodiment of the present invention, the curable materials may further be thermosetting materials, and the curing process is correspondingly a heat treatment process. More specifically, if a thermosetting material is adopted, in the curing process, the material may be heated in an oven and cured. The thermosetting operation is simple and convenient and can be completed via a simple oven.

Obviously, the specific implementation of the embodiment of the present invention is not limited to any curable material and any curing process that are elected. Therefore, the curable material and the corresponding curing process are not limited in at least one embodiment of the present invention and may be any material and any curing methods that are conceived by those skilled in the art within the scope of disclosure of the present invention. Detailed description will be given below by taking the photocurable materials as an example.

As illustrated in FIG. 3, for the convenience of production, a glass substrate is generally adopted as the support substrate 10 in the manufacturing process of the flexible display device; after the PI substrate 11, the flexible display 12 and the overcoat layer 15 are formed, the support substrate 10 (namely the glass substrate) is flipped over; the support substrate 10 is stripped off by an LLO technology; in one specific implementation of the embodiment, the photocurable material (corresponding to the curable material 13 in the drawing) is coated on the surface exposed after the glass substrate (corresponding to the support substrate 10 in the drawing) is stripped off, as shown in FIG. 4; and the process of light illumination is performed so that the coated photocurable material is cured to form the protective film 14, as shown in FIG. 5.

Moreover, as illustrated in FIGS. 4 and 5 continuously, because the flexible display obtained after the glass substrate is stripped off is relatively flexible and not favorable to pick and transfer, in the process of the second specific example of the embodiment, after flipping, a vacuum suction arm 20 is adopted to suck the flexible display device from a lower surface as shown in the drawing, so that the glass substrate is placed upwards and the flexible display 12 is disposed below the glass substrate; in the process of stripping off the glass substrate, the flexible display 12 (together with the PI substrate 11) can be easily disengaged from the glass substrate due to the action of the gravity; subsequently, no movement or position transfer is performed, and the photocurable material (corresponding to 13 in the drawing) are directly coated in situ on the surface exposed after the glass substrate is stripped off; and the process of light illumination is performed to form the protective film 14. In the process of forming the entire protective film, the flexible display 12 (together with the PI substrate 11) is not removed from the vacuum suction arm 20. In addition, by adoption of the coating and light illumination methods, the steps of position transfer and lamination of the protective film are not required, so that not only the possible damage to the flexible display 12 in the covering process can be avoided but also the formation of bubbles in the covering process can be avoided and accordingly the vacuum defoamation process is not required subsequently. In addition, the process of film forming by the above process is simple and easy and can also improve the efficiency and the yield, and reduce the cost without position transfer.

At least one embodiment of the present invention further provides a flexible display device, which comprises the flexible display panel manufactured by the above method. The display device may be: any product or component with display function such as E-paper, OLED panel, mobile phone, tablet PC, TV, display, notebook computer, digital picture frame, navigator and watch. Based on the reasons already described above, the process of forming the protective film is simple and easy, has low cost and high film forming quality, and does not produce bubbles.

The curable materials for forming the protective film are not limited in at least one embodiment of the present invention and may be any curable materials, that satisfy the requirements of the protective film, known by those skilled in the art.

In addition, although the technical solutions of the above embodiments of the present invention relate to the OLED flexible display device and the manufacturing process thereof, the application of the technical solutions of the embodiments of the present invention are not limited to the OLED flexible display device and may also be any devices needing the encapsulation of the protective film. For instance, the display technology capable of realizing flexible display currently further includes liquid crystal display (LCD), EPD, polymer dispersed liquid crystal (PDLC), cholesteric phase liquid crystal (CLC), etc. The technical solutions of the embodiments of the present invention are also applicable to the flexible display device adopting the above technologies and the method for forming the protective film of these flexible display devices.

In the method for manufacturing the flexible display panel and the flexible display device, provided by the embodiments of the present invention, the curable material is coated on the laminated layer after the support substrate is stripped off; subsequently, the curing process is performed so that the curable material is cured to form the protective film; and the laminated layer is not required to be transferred to a laminating/bonding device. The operation is simple and easy; and no bubbles are produced, so the vacuum defoamation process is also not required subsequently any more. Moreover, the film thickness of the protective film formed by the above method may be adjusted so that, for instance, the flexible display can be disposed at the neutral layer of the entire display panel and cannot be easily disengaged from electrodes in the bending process.

The embodiments in the description are all described by progressive means; same and similar parts of the embodiments may refer to each other; and the main descriptions of each embodiment are those different from other embodiments.

The aforesaid is only the preferred embodiments of the present invention and not intended to limit the scope of protection of the present invention. The scope of protection of the present invention should be defined by the appended claims.

The application claims priority to the Chinese patent application No. 201410350125.7, filed on Jul. 22, 2014, the entire disclosure of which is incorporated herein by reference as part of the application.

The invention claimed is:

1. A method for manufacturing a flexible display panel, comprising:
    forming a laminated layer of a substrate, a flexible display, and an overcoat layer on a support substrate in sequence;
    flipping over so that one side provided with the support substrate is placed upward and the laminated layer of the substrate, the flexible display, and the overcoat layer is placed downward;
    stripping off the support substrate;
    coating a curable material directly in situ on a surface of the laminated layer of the substrate, the flexible display, and the overcoat layer after the support substrate is stripped off; and
    performing a curing process so that the coated curable material is cured to form a protective film.

2. The manufacturing method according to claim 1, wherein the curable material is a photocurable material, and the curing process is correspondingly light illumination.

3. The manufacturing method according to claim 2, wherein the photocurable material is an unsaturated polyester resin.

4. The manufacturing method according to claim 2, wherein in coating the curable material on the surface after the support substrate is stripped off, setting a coating thickness of the curable material according to following requirement:
    the protective film formed after the curable material is cured provides that the flexible display is disposed at a neutral layer of the entire flexible display panel.

5. The manufacturing method according to claim 2, further comprising sucking the flexible display panel by a vacuum suction arm.

6. The manufacturing method according to claim 2, wherein in coating the curable material on the surface after the support substrate is stripped off, performing an adopted coating method including spin-coating or slot coating.

7. The manufacturing method according to claim 1, wherein the curable material is a thermosetting material, and the curing process is correspondingly a heat treatment process.

8. The manufacturing method according to claim 7, wherein in coating the curable material on the surface after the support substrate is stripped off, setting a coating thickness of the curable material according to following requirement:
    the protective film formed after the curable material is cured provides that the flexible display is disposed at a neutral layer of the entire flexible display panel.

9. The manufacturing method according to claim 7, further comprising sucking the flexible display panel by a vacuum suction arm.

10. The manufacturing method according to claim 7, wherein in coating the curable material on the surface after the support substrate is stripped off, performing an adopted coating method including spin-coating or slot coating.

11. The manufacturing method according to claim 1, wherein in coating the curable material on the surface after the support substrate is stripped off, setting a coating thickness of the curable material according to following requirement:
    the protective film formed after the curable material is cured provides that the flexible display is disposed at a neutral layer of the entire flexible display panel.

12. The manufacturing method according to claim 1, further comprising sucking the flexible display panel by a vacuum suction arm.

13. The manufacturing method according to claim 1, wherein in coating the curable material on the surface after the support substrate is stripped off, performing an adopted coating method including spin-coating or slot coating.

14. The manufacturing method according to claim 1, wherein stripping off the support substrate is performed using a laser lift-off (LLO) technology.

15. The manufacturing method according to claim 1, further comprising preparing the substrate by polyimide (PI), polyethylene naphthalate (PEN), polyethylene terephthalate (PET), polycarbonate (PC), polyethersulfone (PES) or polymethyl methacrylate (PMMA).

16. A flexible display device, comprising the flexible display panel manufactured by the manufacturing method according to claim 1.

17. A method for manufacturing a flexible display panel, comprising:

forming a laminated layer of a substrate, a flexible display, and an overcoat layer on a support substrate in sequence;

flipping over the laminated layer and sucking the laminated layer from beneath by a suction device, so that one side provided with the support substrate is placed upward and the laminated layer of the substrate, the flexible display, and the overcoat layer is placed downward;

stripping off the support substrate;

coating a curable material on a surface of the laminated layer of the substrate, which is sucked by the suction device, the flexible display, and the overcoat layer after the support substrate is stripped off; and performing a curing process so that the coated curable material is cured to form a protective film.

* * * * *